(12) United States Patent
Wu et al.

(10) Patent No.: US 11,818,884 B2
(45) Date of Patent: Nov. 14, 2023

(54) METHOD FOR MANUFACTURING NON-VOLATILE MEMORY DEVICE

(71) Applicant: Winbond Electronics Corp., Taichung (TW)

(72) Inventors: Chien-Hsien Wu, Taichung (TW); Chun-Hung Lin, Chaiyi (TW); Kao-Tsair Tsai, Kaohsiung (TW); Yao-Ting Tsai, Kaohsiung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 64 days.

(21) Appl. No.: 17/545,519

(22) Filed: Dec. 8, 2021

(65) Prior Publication Data

US 2022/0181339 A1    Jun. 9, 2022

(30) Foreign Application Priority Data

Dec. 9, 2020    (TW) ................................ 109143436

(51) Int. Cl.
   *H01L 21/3105*    (2006.01)
   *H01L 21/76*    (2006.01)
   *H10B 41/00*    (2023.01)
   *H01L 29/66*    (2006.01)

(52) U.S. Cl.
   CPC ....... *H10B 41/00* (2023.02); *H01L 29/66825* (2013.01)

(58) Field of Classification Search
   None
   See application file for complete search history.

(56) References Cited

U.S. PATENT DOCUMENTS

| 2004/0014291 A1* | 1/2004 | Mehrad | H01L 21/76224 257/E21.546 |
| 2006/0128099 A1* | 6/2006 | Kim | H10B 41/35 438/257 |
| 2008/0132073 A1* | 6/2008 | Yoon | H01L 21/31111 257/E21.235 |

(Continued)

FOREIGN PATENT DOCUMENTS

| CN | 101047151 A | 10/2007 |
| TW | 202008513 A | 2/2020 |

OTHER PUBLICATIONS

English translation of Jang et al. KR 2008060336 (Year: 2008).*

*Primary Examiner* — Xiaoming Liu
(74) *Attorney, Agent, or Firm* — Muncy, Geissler, Olds & Lowe, P.C.

(57) ABSTRACT

A method for manufacturing a non-volatile memory device is provided. The method includes forming a trench through a sacrificial layer and extending into a substrate, filling a first insulating material into the trench, and implanting a dopant in the first insulating material by an implantation process. Then, the first insulating material is partially removed to form a first recess between the sacrificial layers. The lowest point of the first recess is lower than the top surface of the substrate. The method includes filling a second insulating material in the first recess and removing the sacrificial layer to form a second recess adjacent to the second insulating material. The method includes forming a first polycrystalline silicon layer in the second recess, and sequentially forming a dielectric layer and a second polycrystalline silicon layer on the first polycrystalline silicon layer.

16 Claims, 7 Drawing Sheets

(56) References Cited

U.S. PATENT DOCUMENTS

2010/0230741 A1    9/2010  Choi et al.
2014/0241053 A1    8/2014  Sandhu et al.
2020/0035794 A1*   1/2020  Chen ..................... H10B 41/50

* cited by examiner

US 11,818,884 B2

METHOD FOR MANUFACTURING NON-VOLATILE MEMORY DEVICE

CROSS REFERENCE TO RELATED APPLICATIONS

This Application claims priority of Taiwan Patent Application No. 109143436, filed on Dec. 9, 2020, the entirety of which is incorporated by reference herein.

BACKGROUND OF THE INVENTION

Field of the Invention

The present invention relates to a semiconductor device, and in particular it relates to a method of manufacturing a non-volatile memory device.

Description of the Related Art

In the existing process for manufacturing a flash memory, after the wet etching used to recess the spin-on glass (SOG), the SOG at different positions may have different etching depths. In other words, the uniformity of the wet etching is poor, and the height of the SOG is different from one another. In the subsequent etching process, the SOG protruding from the tunneling oxide layer may be deformed, thereby causing the floating gate formed subsequently to be deformed. As a result, the performance, yield, operation consistency, and data retention capability of the memory device will be reduced.

With the recent trend toward miniaturization of the manufacturing process, the isolation structure between the floating gates usually has a high aspect ratio, Therefore, the above-mentioned problems will become more serious. How to improve the performance, yield, operation consistency, and data retention capability of the memory device has become an urgent improvement project in this technical field.

BRIEF SUMMARY OF THE INVENTION

The embodiments of the present invention provide a method for manufacturing a non-volatile memory device, which can improve the performance, yield, operation consistency, and data retention capability of the memory device.

In accordance with some embodiments of the present disclosure, a method for manufacturing a non-volatile memory device is provided. The method includes forming a sacrificial layer on a substrate. The method includes forming a trench passing through the sacrificial layer and extending into the substrate. The method includes filling a first insulating material into the trench. The method includes performing an implantation process to implant a dopant into the first insulating material. The method includes after performing the implantation process, partially removing the first insulating material to form a first recess between the sacrificial layers. A lowest point of the first recess is lower than a top surface of the substrate. The method includes filling a second insulating material into the first recess and removing the sacrificial layer to form a second recess adjacent the second insulating material. The method includes forming a first polycrystalline silicon layer in the second recess. The method includes partially removing the second insulating material, so that a top surface of the second insulating material is lower than a top surface of the first polycrystalline silicon layer. The method includes forming a dielectric layer on the first polycrystalline silicon layer and forming a second polycrystalline silicon layer on the dielectric layer.

According to the manufacturing method of the non-volatile memory device provided by the embodiment of the present invention, an implantation process is performed to implant appropriate dopants into the surface of the SOG before etching the SOG. After the implantation process, some of the silicon-oxygen bonds in the SOG are broken, thereby making the molecular weight distribution of the SOG at the surface become more uniform. Therefore, the uniformity of the etching process can be improved, and the deformation of the SOG and the floating gate can be avoided. As a result, the performance, yield, operation consistency, and data retention capability of the memory device can be significantly improved.

BRIEF DESCRIPTION OF THE DRAWINGS

A detailed description is given in the following embodiments with reference to the accompanying drawings. It should be emphasized that many features are not drawn to scale according to industry standard practice. In fact, the dimensions of the various components may be arbitrarily increased or decreased for clarity of discussion.

DETAILED DESCRIPTION OF THE INVENTION

Figure 1A:
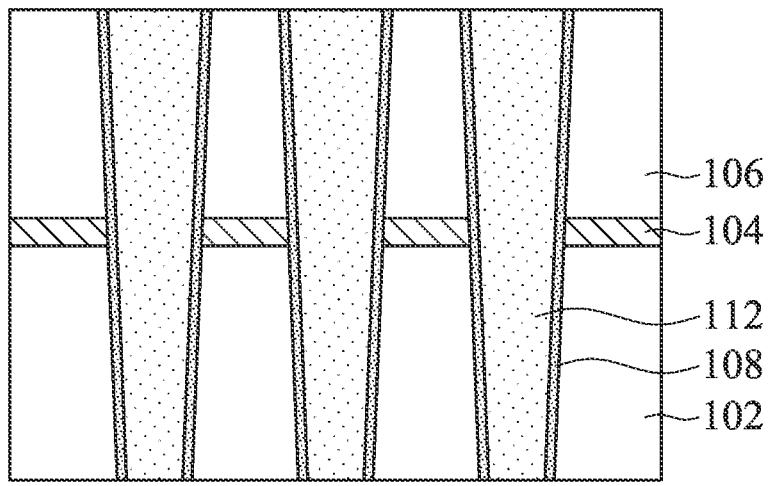
FIG. 1A to FIG. 1G are cross-sectional views corresponding to various steps of manufacturing a non-volatile memory device in accordance with some embodiments of the present invention.

The present disclosure is best understood from the following detailed description when read with the accompanying figures. Furthermore, the present disclosure may repeat reference numerals and/or letters in the various examples. This repetition is for the purpose of simplicity and clarity and does not in itself dictate a relationship between the various embodiments and/or configurations discussed.

In the disclosure, the term "about" or "approximately" means in a range of 20% of a given value or range, preferably 10%, and more preferably 5%. In the disclosure, if there is no specific explanation, a given value or range means an approximate value which may imply the meaning of "about" or "approximately".

A method for manufacturing a non-volatile memory device is provided in the embodiment of the present invention. FIG. 1A to FIG. 1G are cross-sectional views corresponding to various steps of manufacturing a non-volatile memory device 100 in accordance with some embodiments of the present invention. In some embodiments, the non-volatile memory device is a NOR flash memory.

Referring to FIG. 1A, a tunneling oxide layer 104 and a sacrificial layer 106 are sequentially formed on the substrate 102. In some embodiments, the substrate 102 may be a semiconductor substrate. In some embodiments, the material of the substrate 102 may include silicon, gallium arsenide, gallium nitride, germanium silicide, silicon on insulator (SOI), other suitable materials, or a combination thereof. In some embodiments, other structures may also be formed in the substrate 102, for example, doped regions (not shown). In the present embodiment, the substrate 102 is a silicon substrate. The tunneling oxide layer 104 may be formed by a thermal oxidation process. The sacrificial layer 106 may be nitride, oxynitride, carbide or other suitable insulating materials. The sacrificial layer 106 may be formed by a deposition process, for example, a chemical vapor deposition (CVD) process, an atomic layer deposition process (ALD), or a combination thereof. In the present embodiment, the sacrificial layer 106 is silicon nitride.

Then, a patterning process is performed to form a plurality of trenches that pass through the sacrificial layer 106, pass through the tunneling oxide layer 104, and extend into the substrate 102. Next, an insulating liner 108 is conformity formed in the trenches. The insulating liner 108 may be a single-layer structure formed of a single material or a multi-layer structure formed of different materials. In order to simplify the drawings, the insulating liner 108 shown in FIG. 1A to FIG. 1G is a single-layer structure.

In some embodiments, the insulating liner 108 is a double-layer structure consisting of first and second silicon oxide layers. An in-situ steam generation (ISSG) process is used to conformally form the first silicon oxide layer in the plurality of trenches, and a high aspect ratio process (e-HARP) is then used to conformally form the second silicon oxide layer on the first silicon oxide layer. After the first silicon oxide layer and the second silicon oxide layer are formed, an annealing process is performed to improve the compactness of the insulating liner 108. The first silicon oxide layer has excellent uniformity and compactness. On the other hand, the second silicon oxide layer can increase the thickness of the insulating liner 108 without consuming the silicon atoms in the substrate 102, so that more of the available area of the substrate 102 can be reserved. By the insulating liner 108, the adhesion between the substrate 102 and the subsequent SOG can be increased. In addition, the subsequently formed first insulating material 112 may include SOG. The SOG includes impurities, such as, polymers. The insulating liner 108 formed between the first insulating material 112 and the tunneling oxide layer 104 can prevent the SOG from directly contacting the tunneling oxide layer 104, thereby further improving the yield of the non-volatile memory device 100.

Then, a first insulating material 112 is formed and filled into the above-mentioned trenches. Next, a planarization process (for example, a chemical mechanical polishing (CMP) process) is performed to make the top surfaces of the sacrificial layer 106, the insulating liner 108, and the first insulating material 112 coplanar.

The first insulating material 112 is formed between the active regions of the substrate 102 and is used to electrically isolate these active regions. The active regions are located under the tunneling oxide layer 104. In order to exert a good electrical insulation effect, the first insulating material 112 may include nitride, oxide, oxynitride, other suitable insulating materials, or a combination thereof. In order to have a good etching selectivity in the subsequent etching process, the insulating liner 108 and the first insulating material 112 may be different materials. In some embodiments, the first and second silicon oxide layers of the insulating liner 108 are different oxide materials from the first insulating material 112. In the present embodiment, the first insulating material 112 is the SOG. The SOG has good gap-filling capability, which is advantageous to completely fill the trenches when the trenches have a high aspect ratio. Therefore, the generation of voids can be avoided. In one embodiment, after the first insulating material 112 is filled into the trench, the hardness of the first insulating material 112 is increased by a curing process.

Figure 1B:
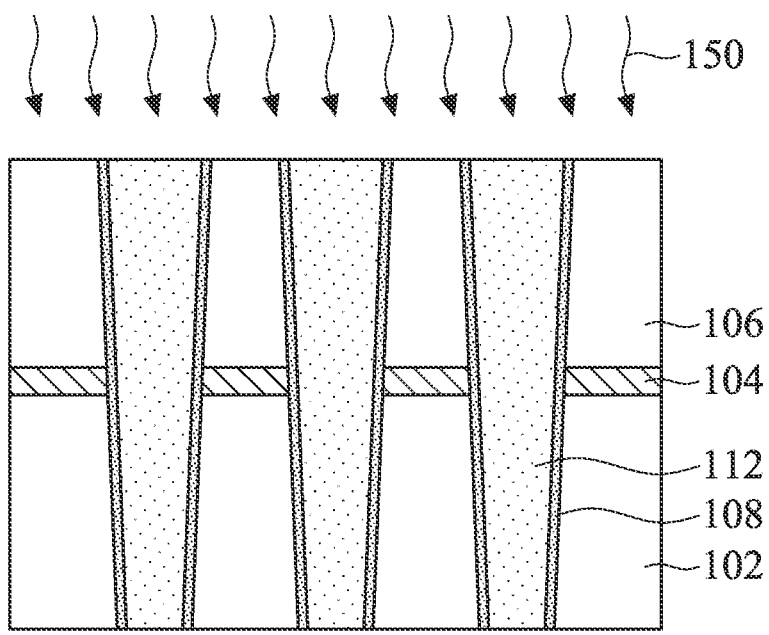

Then, referring to FIG. 1B, an implantation process 150 is performed to implant the dopant into the first insulating material 112.

Figure 1C:
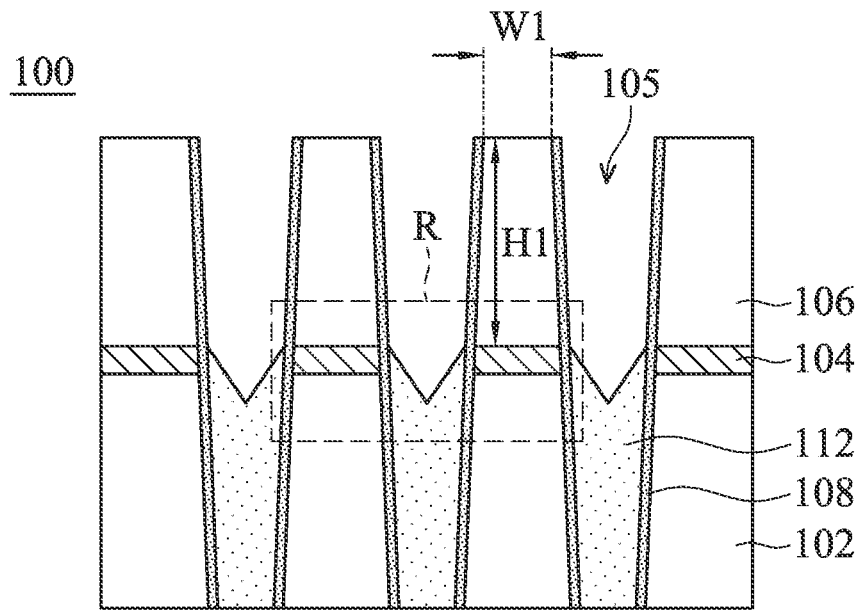

Then, referring to FIG. 1C, after the implantation process 150 is performed, a first etching process is performed to partially remove the first insulating material 112, thereby forming a first recess 105 between the sacrificial layers 106. The first etching process may be a dry etching process, a wet etching process, or a combination thereof. In one embodiment, the first etching process is a wet etching process.

Figure 1D:
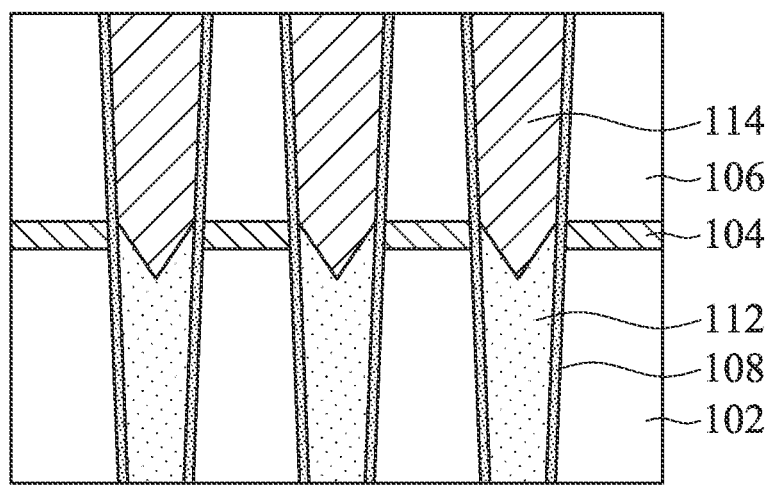

Then, referring to FIG. 1D, a second insulating material 114 is filled inter the first recess 105. Next, a planarization process (for example, a CMP process) is performed to make the top surfaces of the sacrificial layer 106, the insulating liner 108, and the second insulating material 114 coplanar.

Figure 1E:
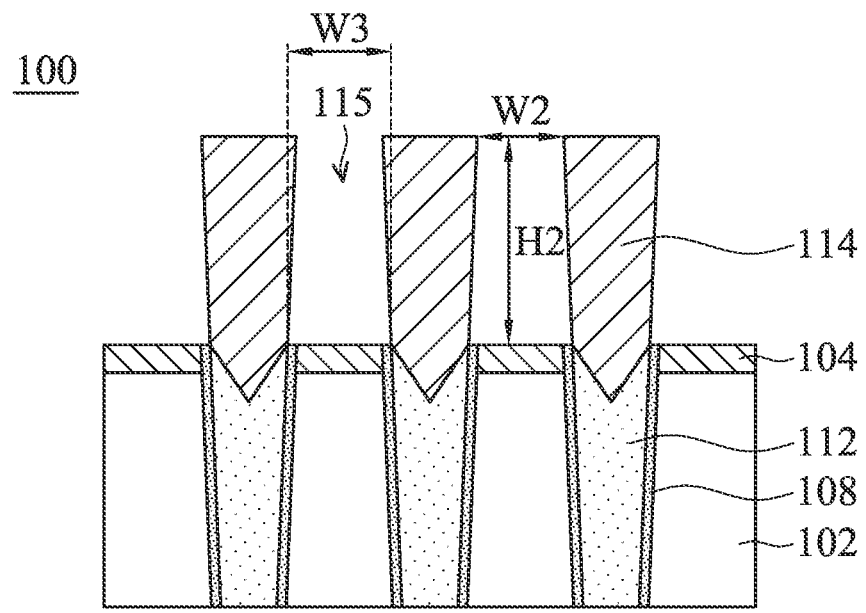
Figure 1F:
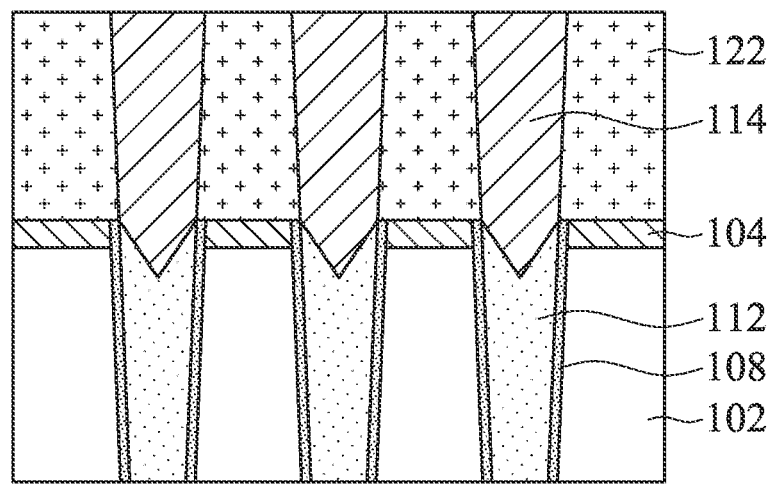

The second insulating material 114 is used to electrically isolate the subsequent floating gate 122 (shown in FIG. 1F). In order to exert a good electrical insulation effect, the second insulating material 114 may include nitride, oxide, oxynitride, other suitable insulating materials, or a combination thereof. Furthermore, in order to have a good etching selectivity in the subsequent etching process, the sacrificial layer 106, the insulating liner 108, and the second insulating material 114 may be different materials. In the present embodiment, the second insulating material 114 is a high-density plasma (HDP) oxide. Compared with the SOG, the high-density plasma oxide has higher hardness and better etching resistance. Therefore, the second insulating material 114 will not be deformed in the subsequent second etching process.

Then, referring to FIG. 1E, a cleaning process is performed to remove residues (for example, oxide) on the surface of the sacrificial layer 106 after the planarization process. Next, a second etching process is performed to remove all the sacrificial layer 106 and a portion of the insulating liner 108, thereby forming a second recess 115 between the second insulating material 114 and exposing the tunneling oxide layer 104. The second etching process may be a dry etching process, a wet etching process, or a combination there of. In some embodiments, the second etching process is a wet etching process.

Then, referring to FIG. 1F, a first polycrystalline silicon layer 122 is formed in the second recess 115. Next, a planarization process (for example, a CMP) is performed to make the top surface of the second insulating material 114 and the top surface of the first polycrystalline silicon layer 122 coplanar.

Figure 1G:
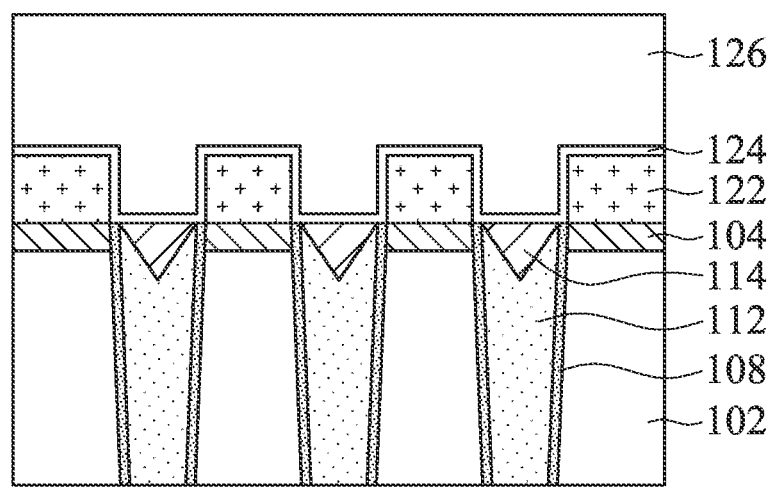

Then, referring to FIG. 1G, perform a third etching process to partially remove the second insulating material 114 so that the top surface of the second insulating material 114 is lower than the top surface of the first polycrystalline silicon layer 122. The third etching process may be a dry etching process, a wet etching process, or a combination thereof, in some embodiments, the third etching process is a dry etching process.

Then, a dielectric layer 124 is conformally formed on the first polycrystalline silicon layer 122 and the second insulating material 114. The dielectric layer 124 may be a single-layer structure formed of a single material or a multi-layer structure formed of different materials. The dielectric layer 124 shown in FIG. 1G is a single-layer structure. The material of the dielectric layer 124 may include oxide, nitride, oxynitride, other suitable dielectric materials, or a combination thereof. In some embodiments, the dielectric layer 124 has a three-layer structure formed of silicon oxide/silicon nitride/silicon oxide. The dielectric layer 124 may be formed by a CVD process.

Then, a second polycrystalline silicon layer 126 is formed on the dielectric layer 124. The first polycrystalline silicon layer 122 and the second polycrystalline silicon layer 126 may be formed independently by a suitable deposition process, for example, a CVD process, an ALD process, or a combination of the foregoing processes. In some embodiments, the first polycrystalline silicon layer 122 and the second polycrystalline silicon layer 126 may independently be doped polycrystalline silicon (for example, p-type doped polycrystalline silicon or n-type doped polycrystalline silicon), and therefore, the first polycrystalline silicon layer 122 and the second polycrystalline silicon layer 126 have better conductivity. In such embodiments, an annealing process may be optionally performed to make the dopants uniformly diffuse in the first polycrystalline silicon layer 122 and the second polycrystalline silicon layer 126. In the present specification, the first polycrystalline silicon layer 122 may also be called as a "floating gate 122", and the second polycrystalline silicon layer 126 may also be called as a "control gate 126".

After the control gate 126 is formed, other conventional processes (for example, patterning the floating gate 122 and the control gate 126) can be subsequently performed to complete the non-volatile memory device 100. These conventional processes are not described in detail herein.

In the present embodiment, the first insulating material 112 is the SOG, and the hardness of the first insulating material 112 is increased by a curing process. However, since the SOG is a polymer based material, after the curing process, the molecular weight of the first insulating material 112 at different depths of the trench will become different. More specifically, in the same trench, compared to the first insulating material 112 located in the central region or the bottom region of the trench, the first insulating material 112 located in the top region of the trench has a better curing effect, and the molecular weight of the cured first insulating material 112 is larger. On the other hand, the curing effects of the first insulating material 112 in different trenches are also different.

Due to different molecular weights, the etching resistance of the first insulating material 112 will vary accordingly. If the first etching process is performed directly after the curing process, the etching depth of the first insulating material 112 at different positions on the same wafer will also be different. If the first insulating material 112 located in the top region of the trench has a larger molecular weight, the depth of this first recess 105 will be shallower after the first etching process. Similarly, if the first insulating material 112 with a large molecular weight located in the top region of the trench is thicker, the depth of this first recess 105 will also be shallower. If the depth of the first recess 105 is shallow, the first insulating material 112 may protrude from the tunneling oxide layer 104 and be located between the sacrificial layers 106. As a result, when the second etching process is subsequently performed, the first insulating material 112 protruding from the tunneling oxide layer 104 will be partially removed and be deformed (for example, the width becomes narrower). If the first insulating material 112 is deformed, the adjacent second recesses 115 will be too close or even connected to each other. When the floating gate 122 is subsequently formed, the floating gate 122 will also be deformed according to the cross-sectional profile of the second recess 115 (that is, the width of the cross-sectional profile of the floating gate 122 will become wider than expected). Therefore, the adjacent floating gates 122 are too close or even contact with each other, which may cause operation errors or short circuits of the memory device. As a result, the performance, yield, operation consistency, and data retention capability of the memory device will be reduced.

According to the manufacturing method of the non-volatile memory device 100 provided by the present embodiment, the uniformity of the etching process can be improved, and the deformation of the first insulating material 112 and the floating gate 122 can be avoided. More specifically, in the present embodiment, after the first etching process, it can be ensured that the first insulating material 112 does not protrude from the top surface of the tunneling oxide layer 104, and it can be ensured that the active region and the tunneling oxide layer 104 are covered by the insulating liner 108 and the first insulating material 112. As a result, the performance, yield, operation consistency, and data retention capability of the memory device can be significantly improved.

In more detail, in the present of embodiment, before performing the first etching process, an implantation process 150 is performed to implant the dopants into the first insulating material 112. Affected by the implantation process 150, some of the silicon-oxygen bonds in the first insulating material 112 are broken. Therefore, the molecular weight of the first insulating material 112 located in the top region of the trench becomes smaller, which can increase the etching rate of the first insulating material 112 during the first etching process. On the other hand, affected by the implantation process 150, the molecular weight distribution of the first insulating material 112 located in the top region of the trench becomes more uniform. Therefore, the molecular weight uniformity of the first insulating material 112 can be improved, and the etching rates of the first insulating material 112 at different positions can be made the same or similar to each other. As a result, during the first etching process, the uniformity of the etching depth of the first insulating material 112 can be significantly improved.

As described above, in the present embodiment, before the second recess 115 is formed, the sacrificial layer 106 and the second insulating material 114 may be partially removed by a planarization process (as shown in FIG. 1D) and a cleaning process. Referring to FIG. 1C, after the first recess 105 is formed, the sacrificial layer 106 has a first height H1, and the top region of the sacrificial layer 106 has a first width W1. Referring to FIG. 1E, after the second recess 115 is formed, the second recess 115 has a second height H2, which is lower than the first height H1, and the top of the second recess 115 has a second width W2 that is wider than the first width W1. In other words, in the present embodiment, even if the second width of the sacrificial layer 106 is narrowed by the implantation process 150, after the planarization process and the cleaning process are performed, the opening width of the second recess 115 (that is, the second width W2) is kept within an appropriate range. In some embodiments, the ratio H2/H1 of the second height H2 to the first height H1 is 0.65-0.85. In such embodiments, the opening width of the second recess 115 may be maintained in an appropriate range. As a result, the performance and yield of the memory device be further improved.

Referring to FIG. 1E, after the second recess 115 is formed, the top of the second recess 115 has a second width W2, and the bottom of the second recess 115 has a third width W3. In order to facilitate the formation of the first polycrystalline silicon layer 122 in the second recess 115 and to avoid voids or gaps formed in the first polycrystalline silicon layer 122, in one embodiment, the ratio W2/W3 of the second width W2 to the third width W3 is at least 0.50. In one embodiment, the ratio H2/W2 of the second height H2 to the second width W2 is 2.0-5.0.

Furthermore, the opening width of the second recess 115 may also be controlled by adjusting, the implantation energy of the implantation process 150. In some embodiments, the implantation energy is in a range of 0.1-5.0 keV. As a result, the implantation depth may be easily controlled in a range of 10 nm to 30 nm, thereby preventing the width of the middle portion of the sacrificial layer 106 from being narrower due to the influence of the implantation process 150. In addition, the performance and yield of the memory device can be further improved.

Furthermore, the opening width of the second recess 115 may also be controlled by selecting appropriate dopants. In some embodiments, the atomic weight or molecular weight of the dopant is in a range of 30-75. As a result, the dopant may be implanted to the required implantation depth without large implantation energy, and the implantation depth is more uniform. In addition, after entering the first insulating material 112 and the sacrificial layer 106, such dopants cannot easily move to other layers (for example, the tunneling oxide layer 104 or the active region). Therefore, the possibility of affecting the properties (for example, electrical resistance value) of other elements can be reduced. As a result, the performance and yield of the memory device can be further improved. In some embodiments, the dopants include, but are not limited to, phosphorus, arsenic, fluorine, or boron fluoride ($BF_2$). In the present embodiment, the dopant is phosphorus. In some embodiments, the dopant concentration is in a range of $10^{13}$ atoms/cm to $10^{14}$ atoms/$cm^3$.

Figure 2:
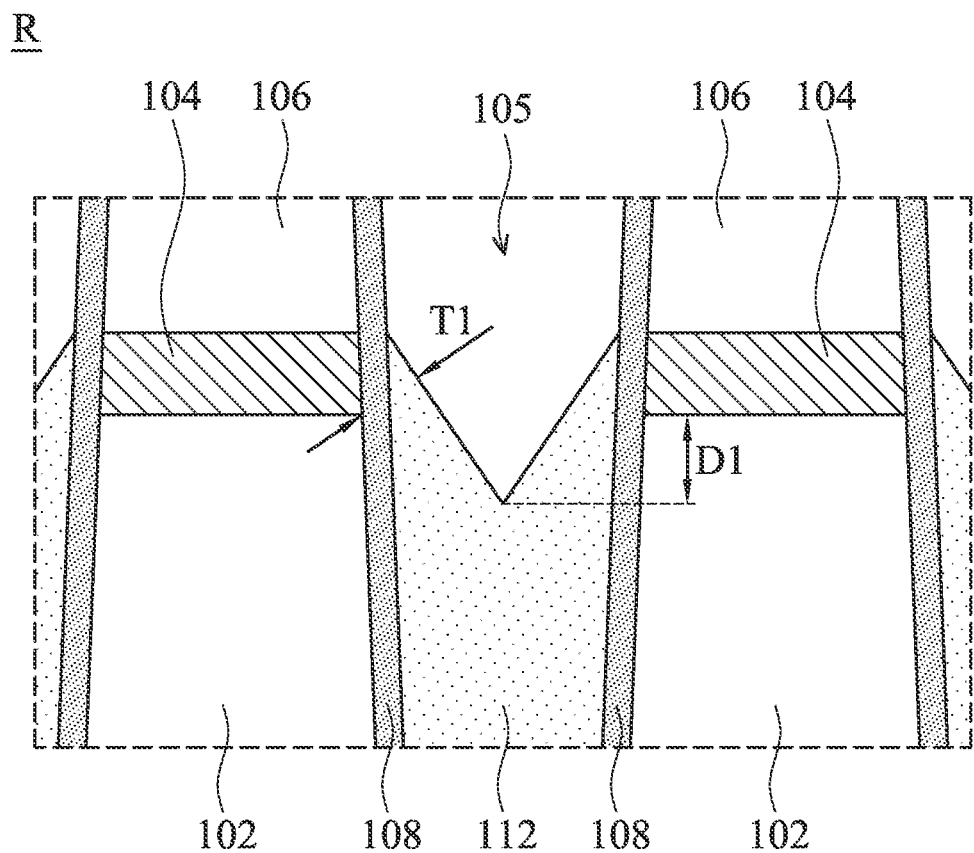
FIG. 2 is an enlarged cross-sectional view of the region R in FIG. 1C.

FIG. 2 is an enlarged cross-sectional view of the region R in FIG. 1C. During the first etching process, the etching rate of the first insulating material 112 is much greater than the etching rate of the insulating liner 108. Therefore, compared with the first insulating material 112 located in the edge region of the first recess 105, the first insulating material 112 located in the central region of the first recess 105 has a larger etching depth.

In the existing process for manufacturing a flash memory, when the second etching process is performed, the first insulating material 112 protruding from the tunneling oxide layer 104 will be partially removed and be deformed. Therefore, the performance, yield, operation consistency, and data retention capability of the memory device are reduced. Referring to FIG. 1C and FIG. 2, in the present embodiment, the lowest point of the first recess 105 is lower than the top surface of the substrate 102, and the highest point of the first insulating material 112 is level with or lower than the top surface of the oxide layer 104. As a result, the deformation of the first insulating material 112 caused by the second etching process can be avoided, and therefore, the performance, yield, operation consistency, and data retention capability of the memory device can be improved.

Referring to FIG. 1C and FIG. 2, in the present embodiment, after the first etching process, the insulating liner 108 and the first insulating material 112 located on the sidewalls of the active region and the sidewalls of the tunneling oxide layer 104 are not removed. In other words, the active region and the tunneling oxide layer 104 are still covered by the insulating liner 108 and the first insulating material 112 without being exposed. During the deposition of the second insulating material 114, the insulating liner 108 and the first insulating material 112 can protect the active region and the tunneling oxide layer 104, so that the active region and the tunneling oxide layer 104 will not be damaged by the plasma of the deposition process. As a result, damage to the active region and the tunneling oxide layer 104 can be avoided, and the performance, yield, operation consistency, and data retention capability of the memory device can be further improved.

Referring to FIG. 2, after the first recess 105 is formed, the distance from the lowest point of the first recess 105 to the top surface of the substrate 102 is a first depth D1, and the shortest distance between the top surface of the substrate 102 and the top surface of the first insulating material 112 is a minimum distance T1. In order to avoid the deformation of the first insulating material 112 and to avoid the damage to the active region and the tunneling oxide layer 104, in one embodiment, the ratio of the minimum distance T1 to the first depth D1 is 1.5-4.

In some embodiments, the first etching process is a two-step wet etching, and buffered hydrofluoric acid (BHF) is used as the etching solution. It may be advantageous to improve the etching uniformity of the first insulating material 112 during the first etching process.

Furthermore, in the present embodiment, the first etching process includes a first step and a second step. In the first step, the concentration of the buffered hydrofluoric acid of the first etching solution is relatively high, and the etching rate of the first insulating material 112 is relatively high. Therefore, it may be advantageous to etch the first recess 105 having a high aspect ratio, and the time required for the etching step may be reduced. In the second step, the concentration of the buffered hydrofluoric acid of the second etching solution is relatively low, and the isotropicity of the etching is relatively high. Therefore, it may advantageous to make the bottom portion of the first recess 105 have the above-mentioned cross-sectional profile, and it may advantageous to improve the etching uniformity of the first insulating material 112.

Figure 3A:
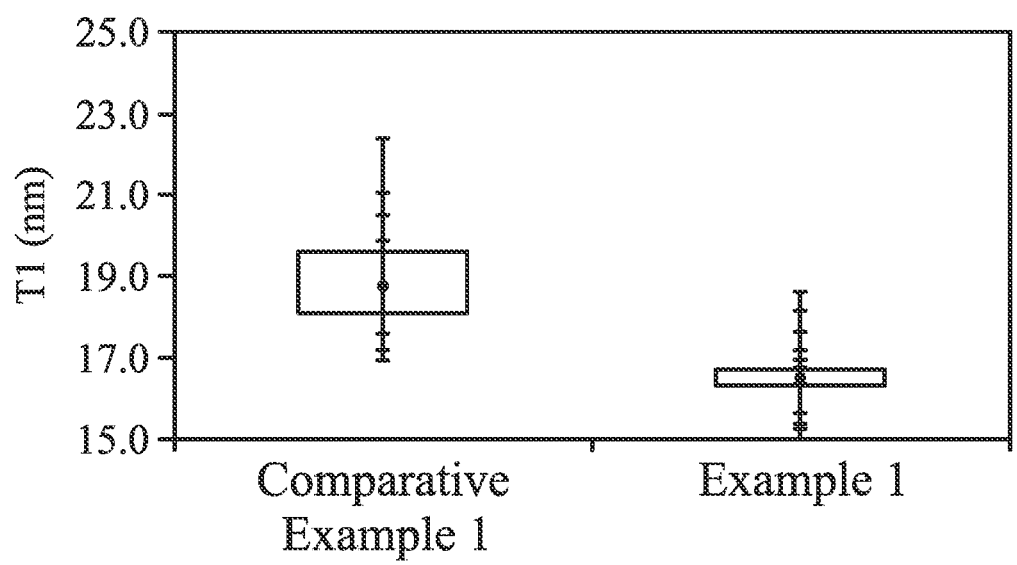
FIG. 3A and FIG. 3B show the experimental results of the variability of the first depth D1 and the minimum distance T1 of the non-volatile memory device of Comparative Example 1 and Example 1.
Figure 3B:
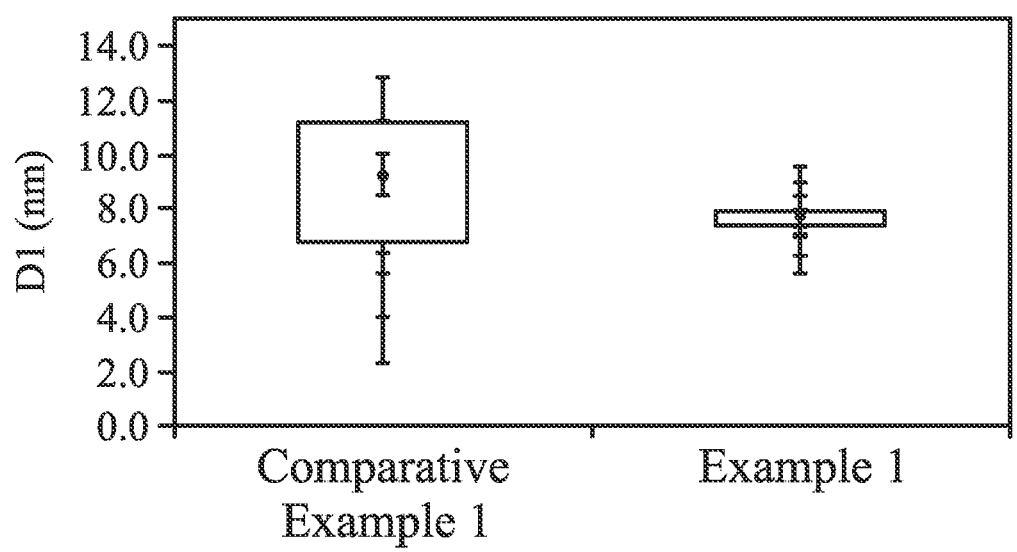

In order to verify influence of the implantation process on the etching uniformity of the first insulating material 112, the inventors of the present invention have conducted experiments and the results are shown in FIG. 3A and FIG. 3B. FIG. 3A and FIG. 3B illustrate the experimental results of the uniformity of the minimum distance T1 and the first depth D1 of the test structures of Comparative Example 1 and Example 1.

The test structure Example 1 was manufactured in accordance with the above-mentioned steps described in FIG. 1A to FIG. 1C, and the first etching process is performed after the implantation process 150 shown in FIG. 1B is performed. The test structure of Comparative Example 1 was manufactured in accordance with the steps similar to the steps of Example 1, except that before the first etching process in Comparative Example 1, the implantation process 150 as shown in FIG. 1B was not performed. For the test structures of Example 1 and Comparative Example 1, five sampling locations were selected (one sampling location was located at the center of the wafer, and the other four sampling locations were located at the edge of the wafer). The cross-sectional profile of the first recess 105 was measured, and the statistical results of the minimum distance T1 and the first depth D1 are shown in FIG. 3A and FIG. 3B, respectively.

In FIG. 3A, if the difference between the maximum value and the minimum value of the minimum distance T1 is smaller, it means that the uniformity of the minimum distance T1 is better. Similarly, in FIG. 3B, if the difference between the maximum value and the minimum value of the first depth D1 is smaller, the uniformity of the first depth D1 is better.

Referring to FIG. 3A, for the test structure of Comparative Example 1, the difference between the maximum value and the minimum value of the minimum distance T1 is about 5.8 nm. For the test structure of Example 1, the difference between the maximum value and the minimum value of the minimum distance T1 is about 3.8 nm. Referring to FIG. 3B, for the test structure of Comparative Example 1, the difference between the maximum value and the minimum value of the first depth D1 is about 11.0 nm. For the test structure of Example 1, the difference between the maximum value and the minimum value of the first depth D1 is about 4.0 nm.

From the above experimental results, it has been verified that performing the implantation process 150 before performing the first etching process can significantly improve the etching uniformity of the first insulating material 112. Therefore, the performance, yield, operation consistency, and data retention capability of the memory device can be improved.

Figure 4:
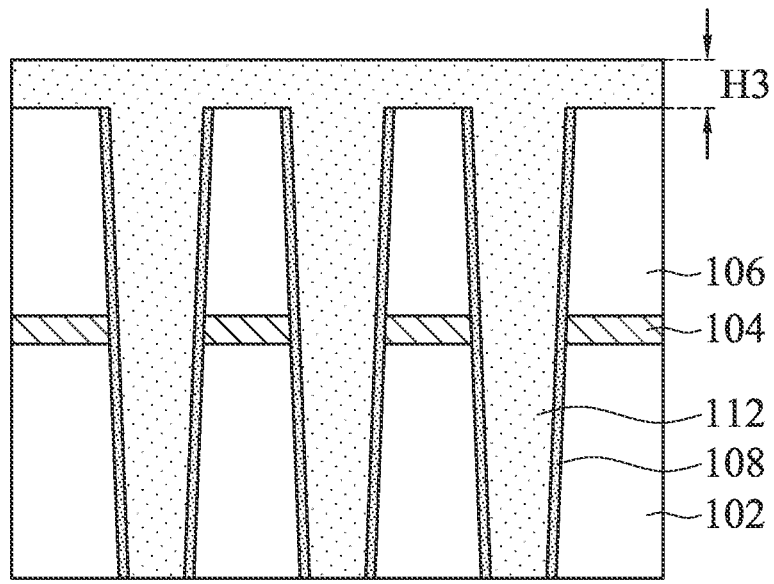
FIG. 4 is a cross-sectional views corresponding to a step of manufacturing a non-volatile memory device in accordance with some embodiments of the present invention.

FIG. 4 is a cross-sectional views corresponding to a step of manufacturing a non-volatile memory device 200 in accordance with some embodiments of the present invention. FIG. 4 is similar to FIG. 1A. In FIG. 4, the same reference numerals are used to denote the same elements as those shown in FIG. 1A. In order to simplify the description, the elements that are the same as those shown in FIG. 1A and the forming process steps thereof will not be described in detail here.

Referring to FIG. 4, in the present embodiment, after the planarization process, the top surface of the first insulating material 112 is higher than the top surface of the sacrificial layer 106. In other words, during the implantation process 150, the top surface of the sacrificial layer 106 is not exposed. The distance between the top surface of the first insulating material 112 and the top surface of the sacrificial layer 106 is a third height H3. In the present embodiment, the third height H3 is 15-40 nm, so that the dopants entering the sacrificial layer 106 and the insulating liner 108 can be greatly reduced. Therefore, even if the implantation process 150 is performed, the etching rate of the sacrificial layer 106 and the insulating liner 108 will not increase significantly, and the cross-sectional profile of the sacrificial layer 106 can be prevented from being deformed (that is, the width of the cross-sectional profile of the sacrificial layer 106 becomes narrower). As a result, the performance and yield of the memory device can be improved.

In summary, according to the manufacturing method of the non-volatile memory device provided by the embodiments of the present invention, before etching the first insulating material, an implantation process is performed to implant appropriate dopants into the surface of the first insulating material. Therefore, the uniformity of the first insulating material in the etching process can be improved, and the deformation of the first insulating material and the floating gate can be avoided. As a result, the performance, yield, operation consistency, and data retention capability of the memory device can be significantly improved. Furthermore, the manufacturing method of the non-volatile memory device provided by the embodiments of the present invention can be easily integrated into an existing manufacturing process without additional replacement or modification of production equipment. As a result, the complexity and production cost of the manufacturing process will not be significantly increased.

According to the manufacturing method of the non-volatile memory device provided by the embodiments of the present invention, before the SOG is etched, an implantation process is performed to implant appropriate dopants into the surface of the SOG. After the implantation process, some of the silicon-oxygen bonds in the SOG are broken, thereby making the molecular weight distribution of the SOG at the surface become more uniform. Therefore, the uniformity of the etching process can be improved, and the deformation of the SOG and the floating gate can be avoided. As a result, the performance, yield, operation consistency, and data retention capability of the memory device can be significantly improved.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A method for manufacturing a non-volatile memory device, comprising:
    forming a tunneling oxide layer on a substrate;
    forming a sacrificial layer on the tunneling oxide layer;
    forming a trench passing through the sacrificial layer and extending into the substrate;
    filling a first insulating material into the trench;
    performing an implantation process to implant a dopant into the first insulating material;
    after performing the implantation process, partially removing the first insulating material to form a first recess between the sacrificial layers, wherein a lowest point of the first recess is lower than a top surface of the substrate and the highest point of the first insulating material is not higher than a top surface of the tunneling oxide layer;
    filling a second insulating material into the first recess;
    removing the sacrificial layer to form a second recess adjacent the second insulating material;
    forming a first polycrystalline silicon layer in the second recess;
    partially removing the second insulating material, so that a top surface of the second insulating material is lower than a top surface of the first polycrystalline silicon layer;
    forming a dielectric layer on the first polycrystalline silicon layer; and
    forming a second polycrystalline silicon layer on the dielectric layer.

2. The method for manufacturing the non-volatile memory device as claimed in claim 1, wherein an atomic weight or a molecular weight of the dopant is in a range of 30-75.

3. The method for manufacturing the non-volatile memory device as claimed in claim 1, wherein the dopant comprises phosphorus, arsenic, fluorine, or boron fluoride.

4. The method for manufacturing the non-volatile memory device as claimed in claim 1, wherein an implantation energy of the implantation process is in a range of 0.1-5.0 keV.

5. The method for manufacturing the non-volatile memory device as claimed in claim 1, wherein an implantation depth of the implantation process is in a range of 10 nm to 30 nm.

6. The method for manufacturing the non-volatile memory device as claimed in claim 1, wherein after the first recess is formed, a distance from the lowest point of the first recess to the top surface of the substrate is a first depth D1, a shortest distance between the top surface of the substrate and a top surface of the first insulating material is a minimum distance T1, and a ratio of the minimum distance T1 to the first depth D1 is 1.5-4.

7. The method for manufacturing the non-volatile memory device as claimed in claim 1, wherein after the first recess is formed, the sacrificial layer has a first height H1, after the second recess is formed, the second recess has a second height H2, and a ratio H2/H1 of the second height H2 to the first height H1 is 0.65-0.85.

8. The method for manufacturing the non-volatile memory device as claimed in claim 7, wherein after the second recess is formed, a top region of the second recess has a second width W2, a bottom of the second recess has a third width W3, and a ratio W2/W3 of the second width W2 to the third width W3 is at least 0.50.

9. The method for manufacturing the non-volatile memory device as claimed in claim 8, wherein after the second recess is formed, a ratio H2/W2 of the second height H2 to the second width W2 is 2.0-5.0.

10. The method for manufacturing the non-volatile memory device as claimed in claim 1, wherein the first insulating material is partially removed by a wet etching process, and wherein the wet etching process comprises:
   etching the first insulating material using a first etching solution, wherein the first etching solution has a first concentration; and
   etching the first insulating material using a second etching solution, wherein the second etching solution has a second concentration lower than the first concentration.

11. The method for manufacturing the non-volatile memory device as claimed in claim 1, further comprising:
   after forming the trench, conformally forming an insulating liner on the substrate and the sacrificial layer, wherein forming the insulating liner comprises using an in-situ steam generation process and a high aspect ratio process.

12. The method for manufacturing the non-volatile memory device as claimed in claim 1, further comprising:
   before performing the implantation process, performing a planarization process to make a top surface of the first insulating material and a top surface of the sacrificial layer coplanar.

13. The method for manufacturing the non-volatile memory device as claimed in claim 1, further comprising:
   before performing the implantation process, performing a planarization process to make a top surface of the first insulating material higher than a top surface of the sacrificial layer.

14. The method for manufacturing the non-volatile memory device as claimed in claim 11, wherein the first insulating material and the insulating liner are made of different materials.

15. The method for manufacturing the non-volatile memory device as claimed in claim 14, wherein the first insulating material includes spin-on glass.

16. The method for manufacturing the non-volatile memory device as claimed in claim 1, further comprising:
   after forming the trench, conformally forming an insulating liner on the substrate and the sacrificial layer; and
   performing a planarization process to make the top surface of the sacrificial layer, the top surface of the insulating liner, and the second insulating material coplanar.

* * * * *